United States Patent
Lee et al.

(10) Patent No.: US 7,532,001 B2
(45) Date of Patent: May 12, 2009

(54) Q-BOOSTING CIRCUIT

(75) Inventors: Young Jae Lee, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 185 days.

(21) Appl. No.: 11/447,747

(22) Filed: Jun. 6, 2006

(65) Prior Publication Data
US 2007/0070665 A1    Mar. 29, 2007

(30) Foreign Application Priority Data
Sep. 27, 2005    (KR) .................. 10-2005-0089713

(51) Int. Cl.
*G01R 33/00* (2006.01)
(52) U.S. Cl. .................... 324/127; 363/97
(58) Field of Classification Search ........... 363/98, 363/132, 131, 127, 16–20; 331/117 FF, 179, 331/113 R, 132, 158, 117 R; 332/127, 152, 332/161, 176; 324/204, 232, 750, 654, 717; 315/205, 247, 225, 265
See application file for complete search history.

(56) References Cited

U.S. PATENT DOCUMENTS

| 4,797,626 | A | | 1/1989 | Honda et al. |
| 5,305,191 | A | * | 4/1994 | Loftus, Jr. .................... 363/17 |
| 5,408,171 | A | | 4/1995 | Eitzmann et al. |
| 6,118,613 | A | * | 9/2000 | Kojima ......................... 360/75 |
| 6,441,590 | B1 | * | 8/2002 | Amantea et al. ............ 323/266 |
| 6,639,481 | B1 | | 10/2003 | Ravi et al. |
| 6,822,434 | B2 | * | 11/2004 | Haslett et al. ............... 324/127 |
| 7,102,454 | B2 | * | 9/2006 | Sze et al. ............... 331/117 FE |

FOREIGN PATENT DOCUMENTS

| KR | 10-20040043934 | 5/2004 |
| KR | 10-20050031193 | 4/2005 |
| KR | 10-20050034345 | 4/2005 |

OTHER PUBLICATIONS

"Low-Power $g_m$-boosted LNA and VCO Circuits in 0.18μm CMOS" Li et al., 2005 IEEE International Solid-State Circuits Conference, Session 29, RF Techniques, 29.3, pp. 534-535 & 615.
'8-GHz CMOS Quadrature VCO Using Transformer-Based LC Tank' Baek et al., IEEE Microwave And Wireless Components Letters, vol. 13, No. 10, Oct. 2003, pp. 446-448.

* cited by examiner

*Primary Examiner*—Rajnikant B Patel
(74) *Attorney, Agent, or Firm*—Ladas & Parry LLP

(57) ABSTRACT

Provided is a Q-boosting circuit for improving a Q factor in a radio frequency (RF) integrated circuit of a semiconductor device using a transformer instead of an inductor. The Q-boosting circuit couples a negative resistance circuit to a pair of terminals of a transformer to reduce a resistance component of the transformer, thereby increasing a mutual inductance component. Therefore, it is possible to obtain a more improved Q factor than a conventional Q factor through adjustment of an inductance and a resistance component, and to obtain the Q factor having a wide range from several tens to several hundreds according to a frequency range.

14 Claims, 6 Drawing Sheets

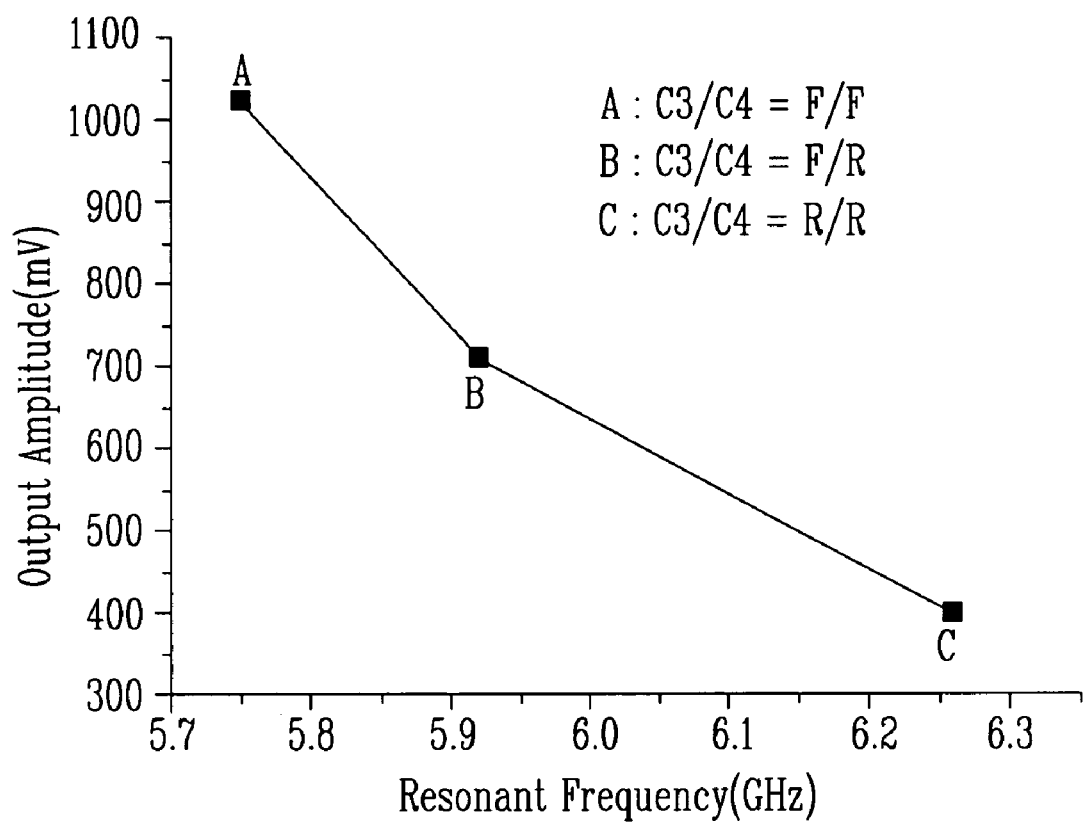

Q-BOOSTING CIRCUIT

CROSS-REFERENCE TO RELATED APPLICATION

This application claims priority to and the benefit of Korean Patent Application No. 2005-89713, filed Sep. 27, 2005, the disclosure of which is incorporated herein by reference in its entirety.

BACKGROUND

1. Field of the Invention

The present invention relates to a radio frequency (RF) integrated circuit of a semiconductor device using a transformer instead of an inductor, and more particularly, to a Q-boosting circuit capable of enhancing a quality factor (Q).

2. Discussion of Related Art

Recently, as a mobile communication service is expanding fast and the size of a terminal is reduced, it is required to reduce the size of an inductance-capacitance (LC) resonator, used in an RF integrated circuit such as a voltage-controlled oscillator (VCO).

When an inductor is integrated, the Q factor of the inductor considerably deteriorates. Thus, in order to solve this problem, a method that embodies an inductor using a transformer has been developed.

FIG. 1 is a circuit diagram illustrating an example of a conventional VCO using a transformer. In the VCO, a core unit of the VCO is coupled to a transformer 11 having two pairs of terminals.

The conventional VCO comprises an LC tank 12 and the core unit. The LC tank 12 includes varactor diodes C1 and C2 coupled between one pair of terminals of the transformer 11, and varactor diodes C3 and C4 coupled between the other pair of terminals, the varactor diodes C1 to C4 being for tuning an oscillation frequency. The core unit further includes transistors Q11 to Q15, gates and drains of some of the transistors are coupled to the pair of terminals.

In the voltage control oscillator, an oscillation frequency is tuned by the varactor diodes C1 and C2 coupled between the pair of terminals of the transformer 11 and the varactor diodes C3 and C4 coupled between the other pair of terminals of the transformer 11. In addition, a mutual inductance increases and thus the Q factor is improved.

FIG. 2 is a circuit diagram illustrating an example of a conventional low noise amplifier (LNA) using a transformer. The LNA has a differential structure converting a single input received through one pair of terminals of a transformer 21 into a differential input.

An RF signal is input through one pair of input terminals of the transformer 21, and a pair of output terminals of the transformer 21 are respectively coupled to an output unit 22 including two serially coupled transistors Q21 and Q22 and an output unit 23 including two serially coupled transistors Q23 and Q24.

In the LNA, since a mutual inductance decreases, inductances of the respective terminals should be exactly estimated to adjust inductance matching therebetween.

In general, a Q factor of an inductor is represented by the following Formula 1:

$$Q = \frac{\omega_0 \cdot L}{R}, \qquad \text{Formula 1}$$

where L is an inductance and R is a resistance.

In this manner, the Q factor of the inductor is determined by the inductance L and the resistance R. The conventional art using the transformer as described above increases only a mutual inductance. This only improves the Q factor but does not significantly increase it because an equivalent resistance component of the transformer itself is kept unchanged. That is, an improvement range of the Q factor is limited.

SUMMARY OF THE INVENTION

It is an object of the present invention to provide a Q-boosting circuit that reduces an equivalent resistance component of a transformer using a negative resistance circuit (e.g., negative conductance (gm) circuit) and thereby solves drawbacks described above.

One aspect of the present invention provides a Q-boosting circuit comprising a transformer that provides an inductance and has at least three pairs of terminals; and a negative resistance circuit coupled to one of the at least three pairs of terminals to reduce a resistance component of the transformer, an external circuit being coupled to at least one of the other pairs of terminals.

The negative resistance circuit may comprise first and second transistors of which drains are respectively coupled to the one pair of terminals and gates are cross-coupled to the drains, and a third transistor that is coupled between sources of the first and second transistors and ground and is supplied with bias voltage through its gate.

The Q-boosting circuit may further comprise a switching unit that is coupled to at least another of the three pairs of terminals in order to increase an overall magnetic flux density.

The present invention is applied to a radio frequency (RF) integrated circuit using a transformer instead of an inductor in a semiconductor device such as a complementary metal oxide semiconductor (CMOS). The present invention couples a negative resistance circuit to one pair of terminals of a transformer having at least three pairs of terminals, thereby reducing a resistance component of the transformer. Therefore, it is possible to obtain a more improved Q factor than a conventional Q factor through adjustment of a mutual inductance component and a resistance component and obtain the Q factor having a wide range from several tens to several hundreds according to a frequency range.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 7 and 8 are graphs showing characteristics obtained by applying a Q-boosting circuit according to the present invention to a VCO.

DETAILED DESCRIPTION OF EXEMPLARY EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 1:
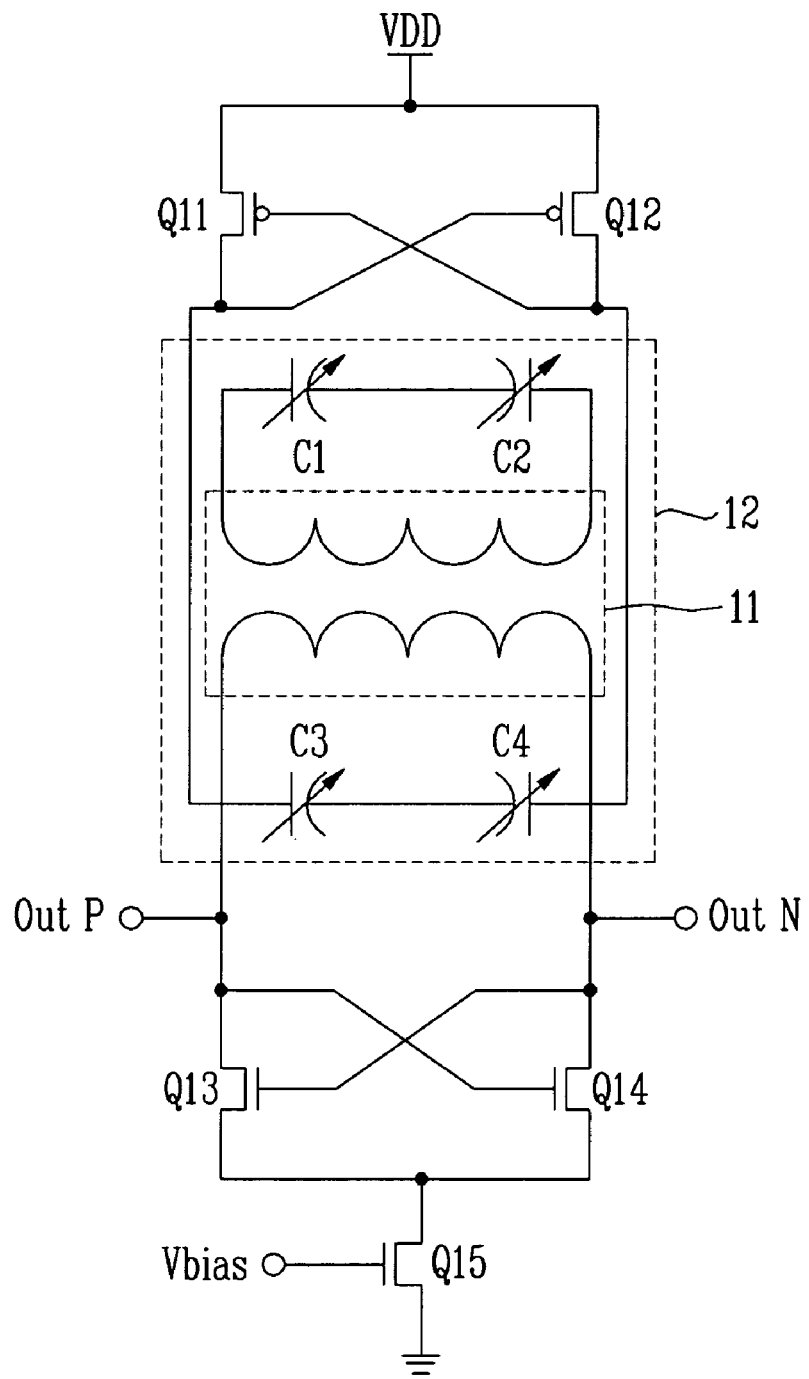
FIG. 1 is a circuit diagram illustrating a conventional voltage-controlled oscillator (VCO) using a transformer.
Figure 2:
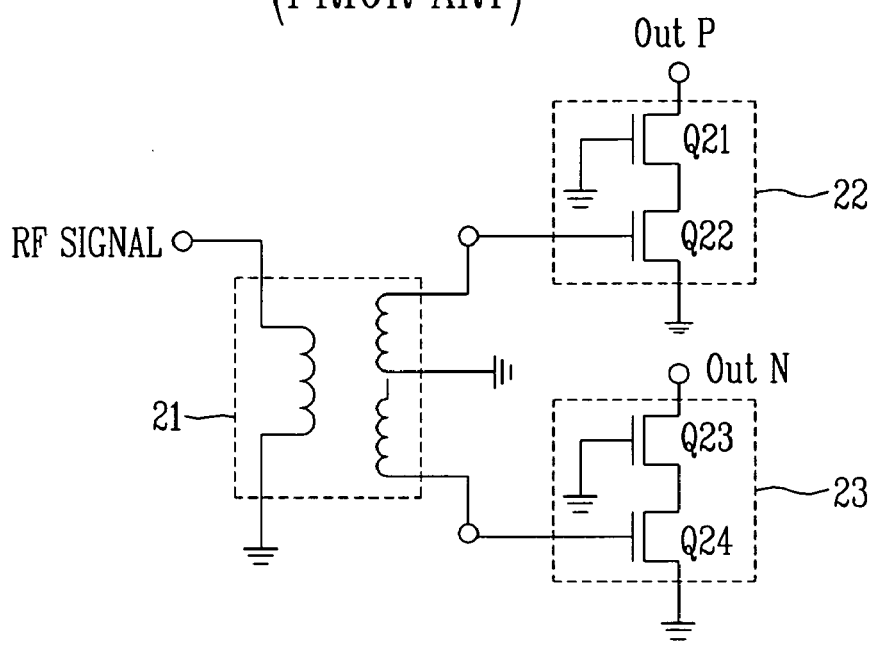
FIG. 2 is a circuit diagram illustrating a conventional low noise amplifier (LNA) using a transformer.
Figure 3:
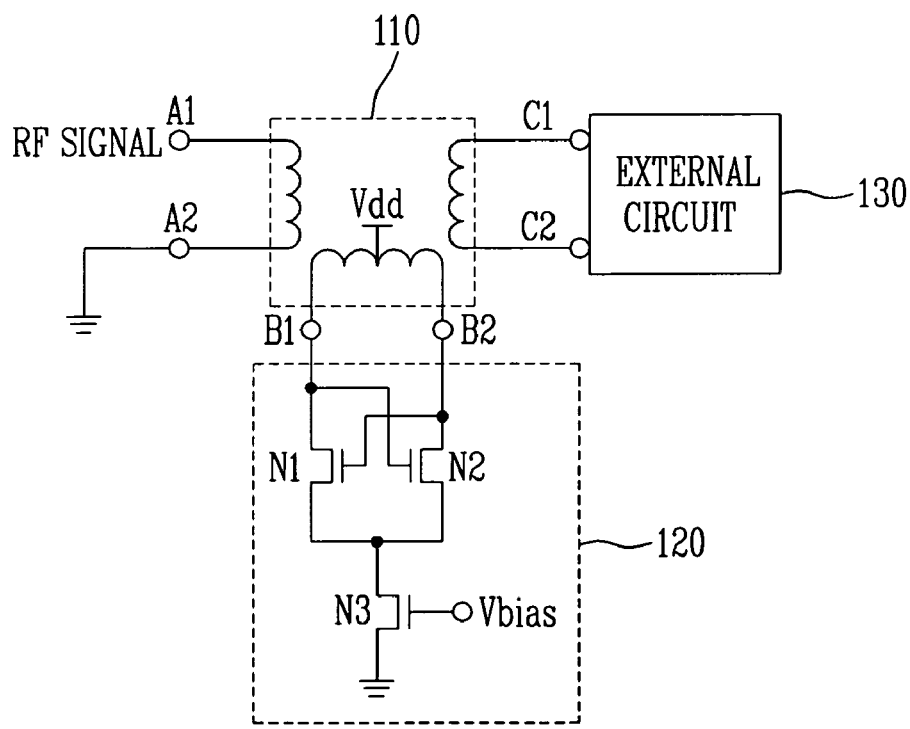
FIG. 3 is a circuit diagram illustrating a Q-boosting circuit according to an exemplary embodiment of the present invention.

FIG. 3 is a circuit diagram illustrating a Q-boosting circuit according to an exemplary embodiment of the present invention. The Q-boosting circuit comprises a transformer 110 for providing a predetermined inductance L, and a negative resistance circuit 120 for reducing a resistance component of the transformer 10.

The transformer 10 includes at least three pairs of terminals A1 and A2, B1 and B2, and C1 and C2, and provides the predetermined inductance L according to numbers of winds of coils each coupled between the terminals A1 and A2, B1 and B2, and C1 and C2. A planar transformer or stacked transformer having a symmetric structure may be used for the transformer 110.

The negative resistance circuit 120 is coupled to the pair of terminals B1 and B2 in order to reduce a resistance component of the transformer 110, and includes first, second and third transistors N1, N2 and N3. The first and second transistors N1 and N2 have drains respectively coupled to the pair of terminals B1 and B2, and gates respectively cross-coupled to the drains. The third transistor N3 is coupled between the sources of the first and second transistors N1 and N2 and ground, and operates according to a bias voltage Vbias supplied through the gate thereof. The negative resistance circuit 120 has a negative resistance R of $$-\frac{2}{gm},$$

which is adjusted according to the bias voltage supplied through the gate of the third transistor N3. A power voltage Vdd is supplied through a coil of the transformer 110 to drive the negative resistance circuit 120.

As can be seen from Formula 1, the inductance L should increase or the resistance R should decrease in order to improve a Q factor of an inductor. Therefore, according to the present invention, the negative resistance circuit 120 is coupled to the pair of terminals B1 and B2 of the transformer 110, and a resistance component of the transformer 110 is reduced through bias adjustment, thereby increasing a mutual inductance component.

The Q-boosting circuit of the present invention composed as described above may be coupled to an external circuit 130 through another pair of terminals C1 and C2.

Figure 4:
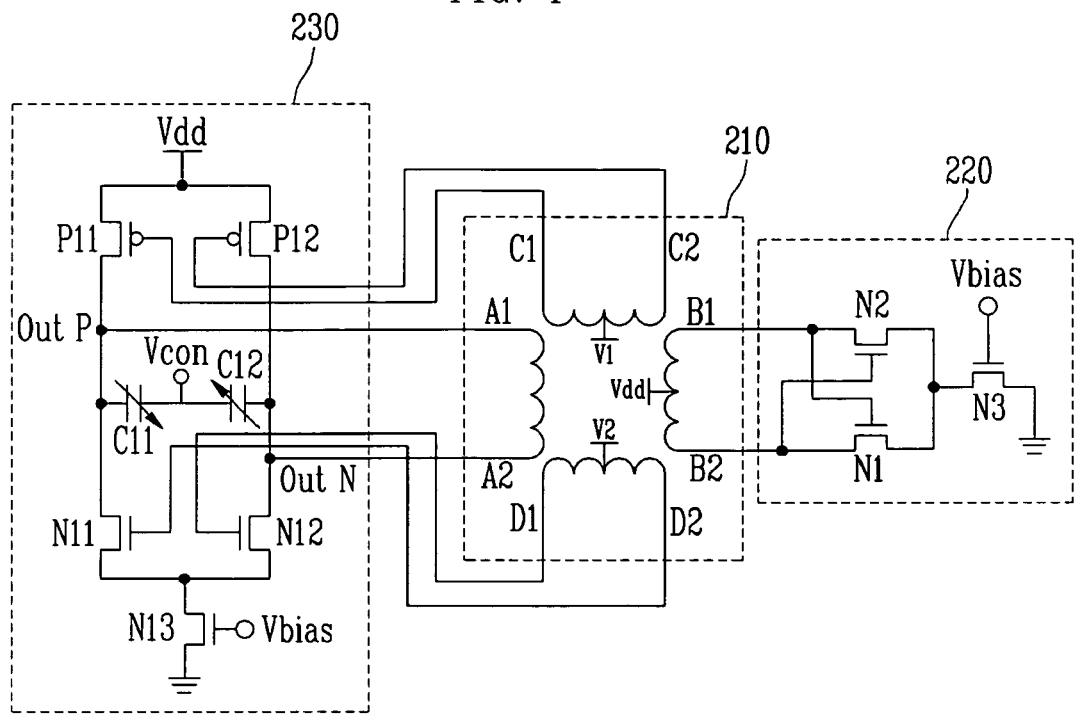
FIG. 4 is a circuit diagram illustrating an example of a VCO employing a Q-boosting circuit of the present invention.

FIG. 4 is a circuit diagram illustrating an example of a voltage-controlled oscillator (VCO) 230 employing a Q-boosting circuit of the present invention, in which a transformer 210 having four pairs of terminals A1 and A2, B1 and B2, C1 and C2, and D1 and D2 is used.

The VCO 230 comprises a plurality of transistors P11, P12, N11, N12 and N13 and a plurality of varactor diodes C11 and C12. The transistors P11 and P12 are respectively coupled between a power voltage Vdd and an output terminal Out P and between the power voltage Vdd and an output terminal Out N. The transistors N11 and N12 are respectively coupled to the output terminals Out P and Out N. The transistor N13 is coupled between the transistors N11 and N12 and ground, and operates according to a bias voltage Vbias. The varactor diodes C11 and C12 are coupled between the output terminals Out P and Out N, and supplied with a control voltage Vcon.

A negative resistance circuit 220 is coupled to the terminals B1 and B2 of the transformer 210. The terminals C1 and C2 of the transformer 210 are respectively coupled to the gates of the transistors P11 and P12 of the VCO 230. The terminals D1 and D2 of the transformer 210 are respectively coupled to the gates of the transistors N12 and N11 of the VCO 230. The terminals A1 and A2 of the transformer 210 are respectively coupled to the output terminals Out P and Out N of the VCO 230. Here, voltages V1 and V2 are respectively applied through coils coupled between the terminals C1 and C2 and between D1 and D2.

Therefore, the coils respectively coupled between the terminals C1 and C2 and between D1 and D2 of the transformer 210 are used for an inductor of the VCO 230, and a Q factor of the inductor is improved by a negative resistance R of the negative resistance circuit 220. More specifically, a resistance component of the transformer 210 decreases by the negative resistance circuit 220, thereby increasing a mutual inductance component and enhancing the Q factor. For example, when the resistance component decreases to a predetermined value by adjusting the bias voltage Vbias of the negative resistance circuit 220, a current increases and the Q factor is improved. In other words, an output waveform can be enlarged and a phase noise characteristic can be improved without increasing a direct current (DC) current.

Figure 5:
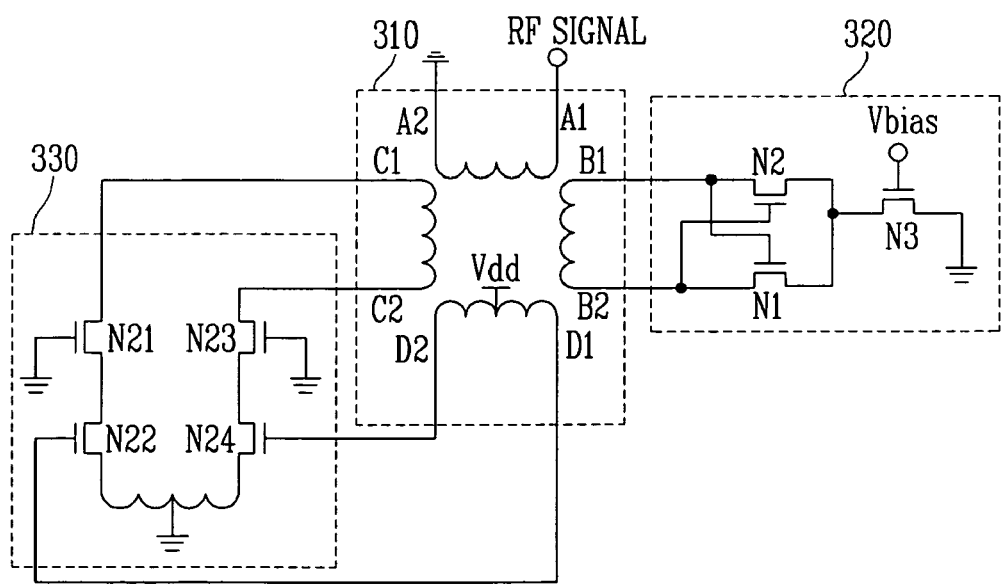
FIG. 5 is a circuit diagram illustrating an example of LNA employing a Q-boosting circuit of the present invention.

FIG. 5 is a circuit diagram illustrating an example of a low noise amplifier (LNA) 330 employing a Q-boosting circuit of the present invention, in which a transformer 310 having four pairs of terminals A1 and A2, B1 and B2, C1 and C2, and D1 and D2 is used.

The LNA 330 comprises transistors N22 and N24 respectively coupled to ground, and transistors N21 and N23 respectively coupled to the transistors N22 and N24 and having grounded gates.

An RF signal is input through the terminals A1 and A2 of the transformer 310, and a negative resistance circuit 320 is coupled to the terminals B1 and B2 of the transformer 310. In addition, the terminals C1 and C2 of the transformer 310 are respectively coupled to the drains of the transistors N21 and N23 of the LNA 330, and the terminals D1 and D2 of the transformer 310 are respectively coupled to the gates of the transistors N22 and N24 of the LNA 330.

The RF signal input through the terminals A1 and A2 of the transformer 310 is converted into a differential input while being transferred to the terminals C1 and C2, and D1 and D2. Here, since current flows through the output terminals C1 and C2 in the opposite direction of the input RF signal, a mutual inductance component is added to a coil of the input terminals D1 and D2. Therefore, a mutual inductance increases, and an equivalent resistance is reduced by the negative resistance circuit 320. In addition, the negative resistance circuit 320 is coupled to the different terminals B1 and B2, and thus input loss is reduced.

Figure 6:
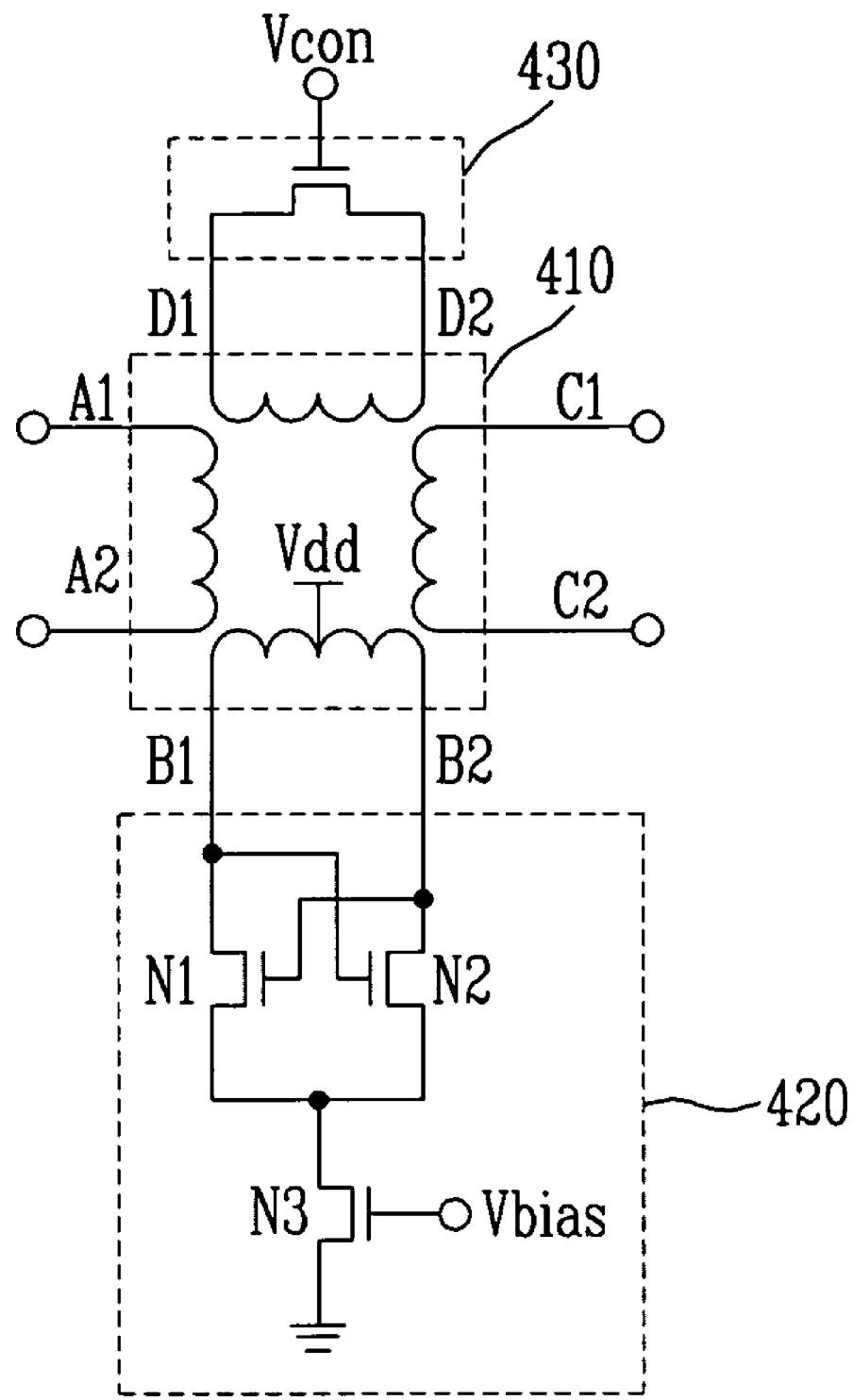
FIG. 6 is a circuit diagram illustrating an example in which a switching unit is added to a Q-boosting circuit of the present invention in order to adjust an overall magnetic flux density.

FIG. 6 is a circuit diagram illustrating an example in which a switching unit 430 is added to a Q-boosting circuit of the present invention in order to adjust the overall magnetic flux density. A negative resistance circuit 420 is coupled to terminals B1 and B2 of a transformer 410 having four pairs of terminals A1 and A2, B1 and B2, C1 and C2, and D1 and D2, and the switching unit 430 operating according to a control voltage Vcon is coupled to the terminals D1 and D2. The switching unit 430 may be composed of an n-channel metal oxide semiconductor (NMOS) transistor.

When the switching unit 430 is turned on-off by the control voltage Vcon, an inductance is changed such that a magnetic flux density and a Q factor are changed. More specifically, directions of currents flowing through the terminals A1 and A2, and C1 and C2 are controlled by turning on-off the switching unit 430, such that the magnetic flux density increases and performance of the entire circuit is improved. However, when the currents flow in the opposite directions, a direction of a magnetic line of force reverses and thus the performance of the entire circuit may deteriorate.

Figure 7:
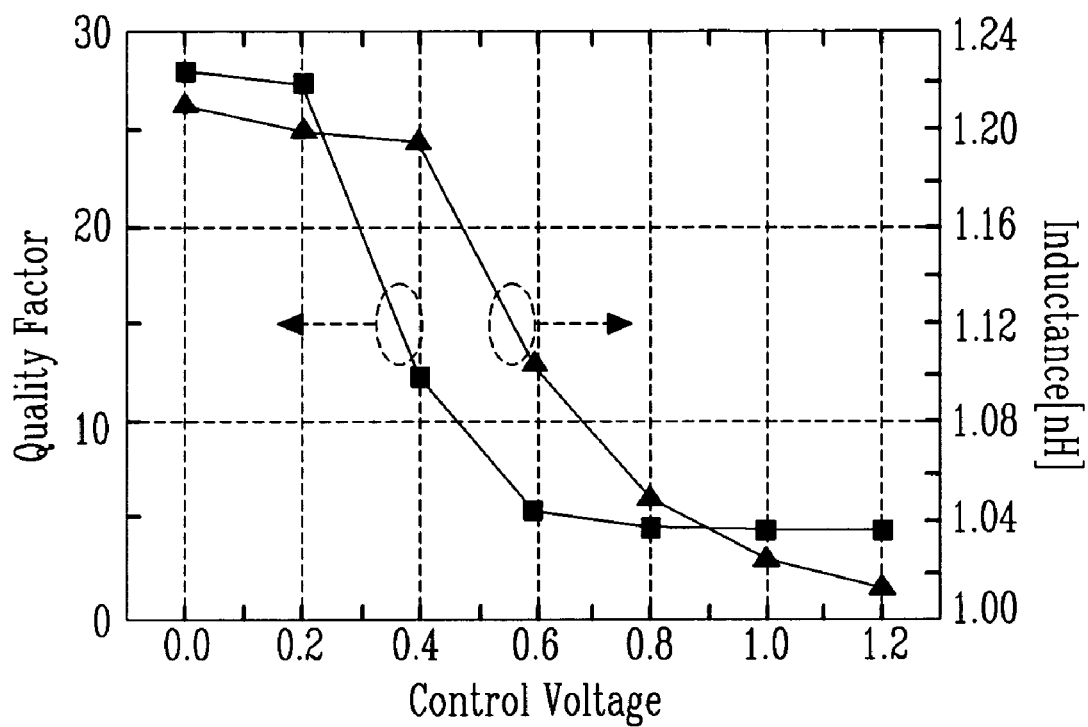

FIGS. 7 and 8 are graphs showing characteristics obtained by applying a Q-boosting circuit according to the present invention to a VCO. FIG. 7 shows changes of a Q factor and an equivalent inductance according to a control voltage Vcon, and FIG. 8 shows an oscillation frequency and amplitude of an output waveform when transformer coupling is made in a forward direction and in a backward direction. It can be seen from FIGS. 7 and 8 that a circuit with improved performance can be embodied applying a Q-boosting circuit of the present invention.

As described above, the present invention couples a negative resistance circuit to a pair of terminals of a transformer having at least three pairs of terminals, and reduces a resistance component of the transformer through bias adjustment, thereby increasing a mutual inductance component. While an improvement range of a Q factor is conventionally limited, the present invention can obtain a more improved Q factor than a conventional Q factor through adjustment of an inductance and a resistance component and can obtain the Q factor having a wide range from several tens to several hundreds according to a frequency range. When a Q factor boosting circuit is applied to an LNA, VCO, or the like, the Q factor and thus performance of the entire circuit can be improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A Q-boosting circuit comprising:
    a transformer providing an inductance, the transformer having at least three windings and at least three pairs of terminals; and
    a negative resistance circuit coupled to one of the at least three pairs of terminals in order to reduce a resistance component of the transformer and enhance a Q factor of the transformer, wherein an external circuit is coupled to at least one of the other pairs of terminals; and
    a switching unit coupled to another pair of terminals of the at least three pairs of terminals in order to increase the total magnetic flux density.

2. The Q-boosting circuit of claim 1, wherein a power voltage is supplied to the transformer in order to supply a bias voltage to the negative resistance circuit.

3. The Q-boosting circuit of claim 1, wherein the negative resistance circuit comprises:
    first and second transistors having drains respectively coupled to the one pair of terminals and gates respectively cross-coupled to the drains; and
    a third transistor coupled between sources of the first and second transistors and ground and supplied with bias voltage through a gate thereof.

4. The Q-boosting circuit of claim 1, wherein the switching unit has a source and a drain coupled to the other pair of terminals and a gate through which a control voltage is supplied.

5. The Q-boosting circuit of claim 1, wherein the external circuit is a voltage-controlled oscillator or a low noise amplifier.

6. A Q-boosting circuit comprising:
    a transformer providing an inductance and having at least three pairs of terminals;
    a negative resistance circuit coupled to one of the at least three pairs of terminals in order to reduce a resistance component of the transformer and enhance a Q factor of the transformer, wherein an external circuit is coupled to at least one of the other pairs of terminals, wherein the negative resistance circuit comprises:
        first and second transistors having drains respectively coupled to the one pair of terminals and gates respectively cross-coupled to the drains; and
        a third transistor coupled between sources of the first and second transistors and ground and supplied with bias voltage through a gate thereof.

7. The Q-boosting circuit of claim 6, wherein a power voltage is supplied to the transformer in order to supply a bias voltage to the negative resistance circuit.

8. The Q-boosting circuit of claim 6, further comprising a switching unit coupled to another pair of terminals of the at least three pairs of terminals in order to increase the total magnetic flux density.

9. The Q-boosting circuit of claim 8, wherein the switching unit has a source and a drain coupled to the other pair of terminals and a gate through which a control voltage is supplied.

10. The Q-boosting circuit of claim 6, wherein the external circuit is a voltage-controlled oscillator or a low noise amplifier.

11. A Q-boosting circuit comprising:
    a transformer providing an inductance and having at least three pairs of terminals;
    a negative resistance circuit coupled to one of the at least three pairs of terminals in order to reduce a resistance component of the transformer and enhance a Q factor of the transformer, wherein an external circuit is coupled to at least one of the other pairs of terminals; and
    a switching unit coupled to another pair of terminals of the at least three pairs of terminals in order to increase the total magnetic flux density, wherein the switching unit has a source and a drain coupled to the other pair of terminals and a gate through which a control voltage is supplied.

12. The Q-boosting circuit of claim 11, wherein a power voltage is supplied to the transformer in order to supply a bias voltage to the negative resistance circuit.

13. The Q-boosting circuit of claim 11, wherein the negative resistance circuit comprises:
    first and second transistors having drains respectively coupled to the one pair of terminals and gates respectively cross-coupled to the drains; and
    a third transistor coupled between sources of the first and second transistors and ground and supplied with bias voltage through a gate thereof.

14. The Q-boosting circuit of claim 11, wherein the external circuit is a voltage-controlled oscillator or a low noise amplifier.

* * * * *